United States Patent [19]

Iwazaki

[11] Patent Number: 4,962,327
[45] Date of Patent: Oct. 9, 1990

[54] DECODER CIRCUIT HAVING SELECTIVE TRANSFER CIRCUIT FOR DECODED OUTPUT SIGNAL

[75] Inventor: Tomonobu Iwazaki, Yamato, Japan

[73] Assignee: Fujitsu Limited, Kawasaki, Japan

[21] Appl. No.: 304,259

[22] Filed: Jan. 31, 1989

[30] Foreign Application Priority Data

Feb. 2, 1988 [JP] Japan .................. 63-022285

[51] Int. Cl.[5] ......................... H03K 19/096
[52] U.S. Cl. ................... 307/449; 307/448; 307/452; 307/481; 365/230.06
[58] Field of Search ............... 307/448–449, 307/451, 453, 463, 465, 468–469, 481; 365/189.02, 189.06, 230.02, 230.06

[56] References Cited

U.S. PATENT DOCUMENTS

| | | | |
|---|---|---|---|
| 4,143,390 | 3/1979 | Noguhi | 307/449 X |
| 4,350,905 | 9/1982 | Sato | 307/449 X |
| 4,479,126 | 10/1984 | Higuchi et al. | 307/436 X |
| 4,642,798 | 2/1987 | Rao | 365/230 |
| 4,661,724 | 4/1987 | Remington et al. | 307/449 |
| 4,724,341 | 2/1988 | Yamada et al. | 307/449 |
| 4,757,218 | 7/1988 | Nawaki | 307/448 X |

Primary Examiner—David Hudspeth
Attorney, Agent, or Firm—Staas & Halsey

[57] ABSTRACT

A decoder circuit comprises a plurality of signal conductors, first potential setting units for setting a potential of the signal conductors to a first potential, second potential setting units for maintaining a potential of one signal conductor at the first potential and bringing a potential of the remaining signal conductors to a second potential, and a plurality of transfer transistors provided for each signal conductor. A gate electrode of the each transfer transistor is connected to each corresponding signal conductor, a source electrode thereof is connected to another signal conductor, and one transfer transistor is switched ON and a decoded output signal is output when a gate potential of the one transfer transistor is maintained at the first potential and a source potential thereof is brought to the second potential. Therefore, only one output signal conductor is selected during a decoder operation without using a discharge detecting circuit of a non selected output signal conductor and a timing signal, and thus an operation speed of the decoder circuit is much higher and the decoding circuit has a simpler construction and is suitable as a large scale integration circuit.

16 Claims, 8 Drawing Sheets

DECODER CIRCUIT HAVING SELECTIVE TRANSFER CIRCUIT FOR DECODED OUTPUT SIGNAL

BACKGROUND OF THE INVENTION

1. Field of the Invention

The present invention relates to a decoder circuit, more particularly, to an output portion or a buffer portion of a dynamic type decoder circuit used for selecting a memory cell of a memory device.

2. Description of the Related Art

In the prior art, a decoder circuit is used for decoding an input signal and for selecting and outputting an appropriate signal one of, a plurality of signal conductors. A decoder circuit is used for various purposes, but in the example given below, the decoder circuit is used for selecting a memory cell of a memory such as a ROM (Read Only Memory) or PLA (Programmable Logic Array), and the like.

For example, a conventional decoder circuit comprises a decoder portion, a buffer portion, and a control portion. The decoder portion includes input signal conductors and output signal conductors, the input signal conductors being complementary signal conductors and the output signal conductors being provided so as to cross the input signal conductors. A cell transistor is provided for each crossed portion of the input signal conductors and the output signal conductors, and one of the output signal conductors is selected in accordance with logic decoding of the contents information content of the input signals. Output portions of the output signal conductors are provided, for example, with NAND circuits, and the input terminal of each of the NAND circuits is connected to a corresponding one of the output signal conductors and the other input terminal thereof is supplied with a timing signal. This timing signal is input to the aforesaid other input terminals of all the NAND circuits after changing the potential of the output signal conductors, except for the aforesaid one, selected output signal conductor, to a low level. Namely, the timing signal is used to avoid a selection error, and this timing signal is output from a control portion in the decoder circuit. The control portion comprises, for example, an inverter having an input supplied with the potential of a dummy signal conductor wired in the same manner as the output signal conductors, a NAND circuit, and an inverter.

The above conventional decoder circuit has problems in that the timing signal should be applied to the NAND circuit, and the word lines should be driven by the timing signal through the NAND circuit in the output portions of the output signal conductors. Namely, the timing signal should be generated after all unselected output signal conductors have been fully discharged. Therefore, the output timing of the timing signal must include a time margin, taking into consideration the discharge time required for fully discharging an electrical charge in each of the output signal conductors, whereby the drive timing of the word line corresponding to the selected output signal conductor is delayed and thus hinders high speed operation of the decoder circuit. Further, the NAND circuits in the output portions of the output signal conductors and the control portions must be provided, and thus the construction of the decoder circuit becomes complicated.

SUMMARY OF THE INVENTION

An object of the present invention is to provide a decoder circuit having a simple configuration, a high speed operation and stable operation, and which is for implementation in a large scale integrated circuit.

According to the present invention, there is provided a decoder circuit which comprises a plurality of signal conductors, first units for setting a first potential, second units for setting a second potential, and a plurality of transfer transistors. The first potential setting units are connected to the signal conductors to set the potential of the signal conductors at a first potential, and the second potential setting units are connected to the signal conductors to maintain the potential of one of the signal conductors at the first potential and to reduce the potential of the rest of the signal conductors to the second potential. Plural transfer transistors are provided the respective, plural signal conductors, the gate electrode of the each transfer transistor being connected to an individual corresponding signal conductor, and the source electrode thereof being connected to another signal conductor. When the gate potential of a selected transfer transistor is maintained at the first potential and the source potential thereof is reduced to the second potential, the selected one of the transfer transistors is switched ON and a decoded output signal is output.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

A decoder circuit is used for decoding input signal and for selecting and outputting an appropriate signal or, one of a plurality of signal conductors. The decoder circuit may be used for various purposes, but in the given below example, the decoder circuit is used for selecting a memory cell of a memory such as a ROM (Read Only Memory), and the like.

First, a conventional decoder circuit applied to a read only memory is explained with reference to FIGS. 1, 2, and 3.

Figure 1:
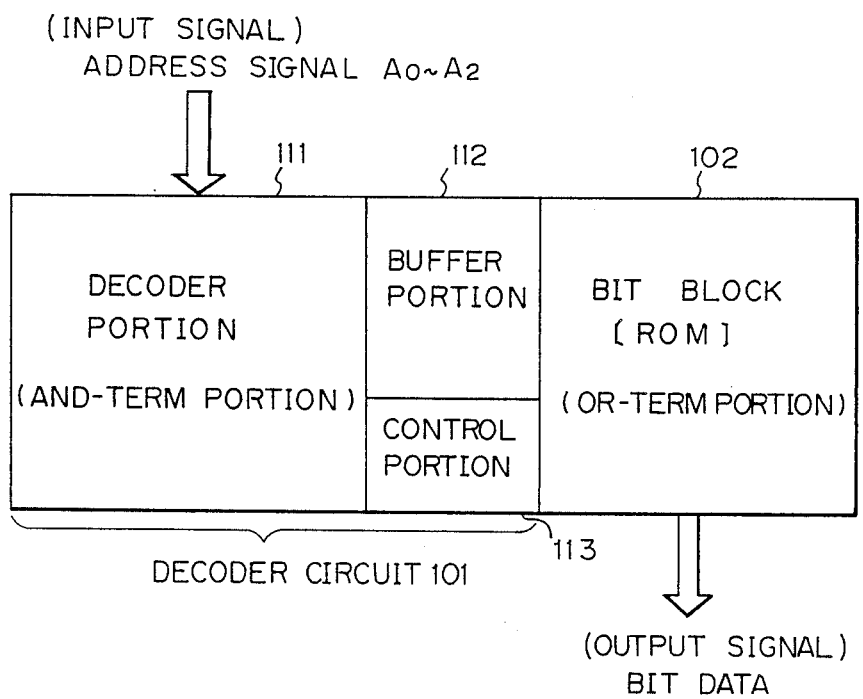
FIG. 1 is a block diagram showing one example of a prior art decoder circuit applied to a read only memory.

FIG. 1 is a block diagram showing one example of a prior art decoder circuit applied to a read only memory. As shown in FIG. 1, the decoder circuit 101 comprises a decoder portion 111, i.e., an AND-term portion, a buffer portion 112, and a control portion 113. The decoder circuit 101 is connected to a bit block 102, i.e., an OR-term portion, and selects one word line of the OR-term portion in accordance with an input signal address signal comprising of $A_0$–$A_2$, so that an output signal comprising bit data is output from the bit block 102.

Figure 2:
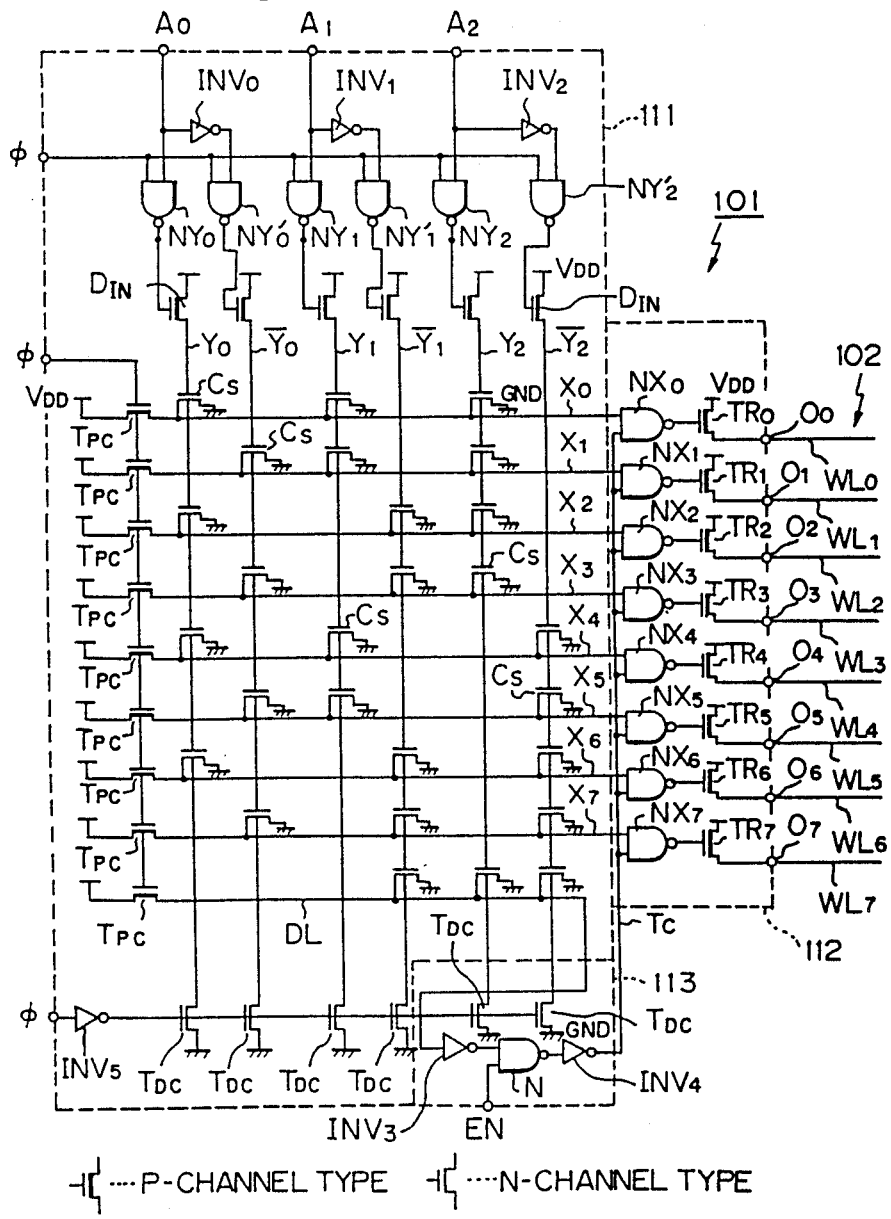
FIG. 2 is a circuit diagram showing one example of the decoder circuit shown in FIG. 1.
Figure 3:
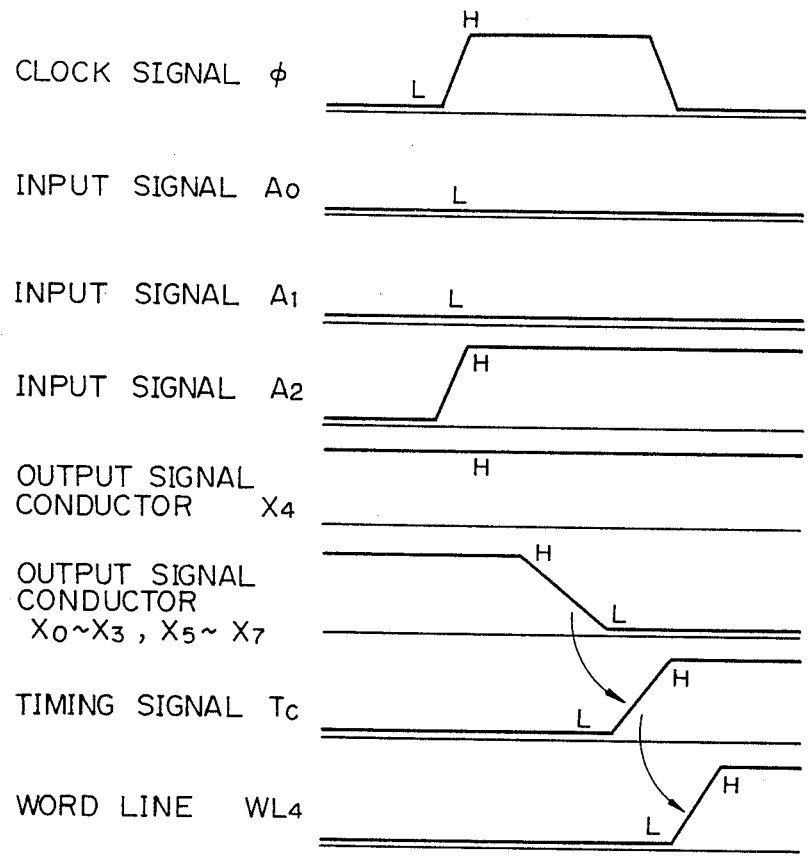
FIG. 3 is a timing chart explaining an operation of the decoder circuit shown in FIG. 2.

FIG. 2 is a circuit diagram showing one example of the decoder circuit as shown in FIG. 1. This decoder circuit 101 is a dynamic type circuit wherein input signal conductors $Y_0$–$\overline{Y_2}$ are constructed by complementary signal conductors such as the pair $Y_0$ and $\overline{Y_0}$, the pair $Y_1$ and $\overline{Y_1}$, and the pair $Y_2$ and $\overline{Y_2}$. Output signal conductors $X_0$–$X_7$ are provided so as to cross the input signal conductors $Y_0$–$\overline{Y_2}$. A cell transistor Cs is provided for each crossed portion of the input signal conductors $Y_0$–$\overline{Y_2}$ and the output signal conductors $X_0$–$X_7$, and one of the output signal conductors is selected in accordance with logic decoding of the input signals $A_0$–$A_2$. Note, each cell transistor Cs is formed by an N-channel MIS transistor.

In the decoder portion 111, input portions of the input signal conductors $Y_0$–$\overline{Y_2}$ are provided with NAND circuits $NY_0$–$NY_2$ to which input signals $A_0$–$A_2$, inverted signals $\overline{A_0}$–$\overline{A_2}$, corresponding to the input signals $A_0$–$A_2$, and a clock signal $\phi$ are applied. Namely, one input terminal of the NAND circuits $NY_0$, $NY_1$, and $NY_2$ is supplied with the input signals $\overline{A_0}$, $\overline{A_1}$, and $\overline{A_2}$, respectively, one input terminal of the NAND circuits $NY_0'$, $NY_1'$ and $NY_2'$ is supplied with the inverted input signals $A_0$, $A_1$, and $A_2$ which inverted from $A_0$, $A_1$, and $A_2$ by inverter circuits $INV_0$, $INV_1$, and $INV_2$ respectively, and the other input terminals of the all of the NAND circuits $NY_0$–$NY_2'$ are supplied with the clock signal $\phi$. An output terminal of each of the NAND circuits $NY_0$–$NY_2'$ is connected to the corresponding input signal conductors $Y_0$–$\overline{Y_2}$ through respective drive transistors DIN which are P-channel type MIS transistors.

In the buffer portion 112, output portions of the output signal conductors $X_0$–$X_7$ are provided with respective NAND circuits $NX_0$–$NX_7$, and one input terminal of each of the NAND circuits $NX_0$–$NX_7$ is connected to the respective output signal conductors $X_0$–$X_7$. The other input terminal of each of the NAND circuits $NX_0$–$NX_7$ is supplied with a timing signal Tc after changing the potential of the output signal conductors, except one selected output signal conductor, to a low level. Namely, the timing signal Tc is used to avoid a selection error, and this timing signal is output from a control circuit 113 in the decoder circuit 101.

The control circuit 113 comprises an inverter $INV_3$ having an input supplied with the potential of a dummy signal conductor DL wired in the same manner as the output signal conductors $X_0$–$X_7$, a NAND circuit N, and an inverter $INV_4$.

The other sides of the input signal conductors $Y_0$–$\overline{Y_2}$ are provided with discharge transistors $T_{DC}$ which are switched ON while the clock signal $\phi$ is at a low level. These transistors are N-channel type MIS transistors, and gate electrodes thereof are supplied through inverter $IV_5$ with an inverted clock signal $\overline{\phi}$.

The other sides of the output signal conductors $X_0$–$X_7$ are provided with precharge transistors Tpc which are driven by the clock signal $\phi$. The precharge transistors Tpc, which are P-channel type MIS transistors, are switched ON when the clock signal $\phi$ is at a high level, and the output signal conductors $X_0$–$X_7$ and the dummy signal conductor DL are precharged to a power source potential $V_{DD}$.

The output terminals of the NAND circuits $NX_0$–$NX_7$ are connected to gate electrodes of the output transistors $TR_0$–$TR_7$ (P-channel type MIS transistors), respectively. Note, the drain electrodes of the output transistors $TR_0$–$TR_7$ serve as output terminals $O_0$–$O_7$ in this decoder circuit 101, and are connected, for example, to a cell array of the ROM 102 through word lines $WD_0$–$WD_7$.

The above described decoder circuit is formed by a C-MIS circuit, as shown in FIG. 2, wherein transistors shown by a thick line are P-channel type MIS (P-MIS) transistors and a transistor shown by a normal line is an N-channel type MIS (N-MIS) transistor, Note, an N-MIS transistor is switched ON when an input signal thereof is at a high level, and a P-MIS transistor is switched ON when an input signal thereof is at a low level.

Next, the operation of the above circuit is explained with reference to FIG. 3.

A period during which the clock signal $\phi$ is at a low level corresponds to a reset period of the decoder circuit 101, and a period during which the clock signal $\phi$ is at a high level corresponds to an active period of the decoder circuit 101.

First, in the period during which the clock signal $\phi$ is at a low level, the precharge transistors Tpc and the discharge transistors $T_{DC}$ are switched ON, all of the input signal conductors $Y_0$–$\overline{Y_2}$ are discharged, and all of the output signal conductors $X_0$–$X_7$ are precharged. In this case, all output signals of the NAND circuits $NY_0$–$NY_2'$ are at a high level, and thus all of the input transistors $D_{IN}$ are switched OFF. When the clock signal $\phi$ goes from the low level to a high level, all of the precharge transistors Tpc are switched on and all of the discharge transistors $T_{DC}$ are switched OFF, and the input signal conductors $Y_0$–$\overline{Y_2}$ are at a high level or a low level in accordance with the current address signals (input signals $A_0$, $A_1$, and $A_2$ As a result, one of the output signal conductors $X_0$–$X_7$ is maintained at the precharged level, and the other output signal conductors are discharged through the cell transistors Cs.

For example, when the input signal $A_0$ is at a low level, $A_1$ is at a low level and $A_2$ is at a high level, the input signal conductors $Y_0$, $Y_1$, and $\overline{Y_2}$ are brought to a low level, and the other signal conductors are brought to a high level. Consequently, only one output signal conductor $X_4$ is selected by the above potential relationship of the input signals $A_0$, $A_1$ and $A_2$ and a the circuit connections to the cell transistors Cs. In this case, the potential of the selected output signal conductor $X_4$ is maintained at the high level, and the other output signal conductors $X_0$–$X_3$ and $X_5$–$X_7$ are discharged and brought to a low level by the respectively corresponding cell transistors Cs. Next, the timing signal Tc (high level) is input to the NAND circuits $NX_0$–$NX_7$, after all of the unselected output signal conductors $X_0$–$X_3$ and $X_5$–$X_7$ are discharged, and thus an input of only the NAND circuit $NX_4$ corresponding to the selected output signal conductor $X_4$ is brought to a high level and a low level signal thereby is output to the associated output transistor $TR_4$. Consequently, only the output transistor $TR_4$ is switched ON, and word line $WL_4$ is driven.

The timing for generating the timing signal Tc is determined by the discharge time of the dummy signal conductor DL. Namely, the dummy signal conductor DL has the longest discharge time relative to (or longer than the longest discharge time of) the output signal conductors $X_0$-$X_7$. Note, the dummy signal conductor DL is not selected (i.e., is always discharged) regardless of the address signals $A_0$-$A_2$. As a result the potential of the dummy signal conductor DL is always changed to a low level in each decoding operation, when an output signal conductor is selected. In the control portion 113, this signal of the dummy signal conductor DL is applied to an input of the inverter $IV_3$, and when the other input of a NAND circuit N is supplied with a high level enable signal EN from another circuit (not shown in the drawing) a high level timing signal Tc is output from the inverter $IV_4$. As described above, the timing signal Tc must be output after it is confirmed that all of the unselected output signal conductors $X_0$-$X_3$ and $X_5$-$X_7$ are fully discharged, since an error may be generated in that a plurality of output signal conductors would be selected if the timing signal Tc is applied before the discharge operation described above is completed.

As described above, the conventional decoder circuit 101 has problems in that the timing signal Tc should be applied to the NAND circuits and the word lines must be driven by the timing signal Tc through the NAND circuits $NX_0$-$NX_7$. Namely, as understood from FIG. 3, the timing signal Tc must be generated after the all of the nonselected output signal conductors $X_0$-$X_3$ and $X_5$-$X_7$ are fully discharged. Therefore, the output timing of the timing signal Tc must include a time margin, taking into consideration the discharge time for fully discharging an electrical charge in each of the output signal conductors $X_0$-$X_7$, and thus the drive timing of the word line $WL_4$ corresponding to the selected output signal conductor $X_4$ is delayed and hinders high speed operation of the decoder circuit.

Further, in the decoder circuit 101, there must be provided the NAND circuits $NX_0$-$NX_7$ of the buffer portion 112 and, in the control portion 113, the inverter $INV_3$, the NAND circuit N, and the inverter $INV_4$ and thus the construction of the decoder circuit 101 is complicated. Furthermore, when C-MIS transistors are used, a NAND circuit is formed by four transistors, and thus a problem arises in a pattern layout of the decoder circuit, when the decoder circuit is used by a large scale integration circuit. Namely, when the four transistors of the NAND circuit are provided in parallel with the input signal conductors, a large space is occupied by these four transistor; on the other hand, if the four transistors of the NAND circuit are provided in series, a wiring process for connecting these four transistors must be carried out. Therefore, a problem arises whenever a large number of transistors is used for the NAND circuit. For example, when used as an address decoder of a ROM, the scale of the decoder circuit as a peripheral circuit is too large to realize the purpose of making a memory cell small, and thus it is difficult to insert the buffer portion in a small space between two adjacent signal conductors or in the space between neighboring word lines.

The present invention provides a decoder circuit having a simple configuration, a high speed and stable operation, and which is suitable for implementation as a large scale integrated circuit.

Below, an embodiment of the present invention will be explained with reference to the drawings.

Figure 4:
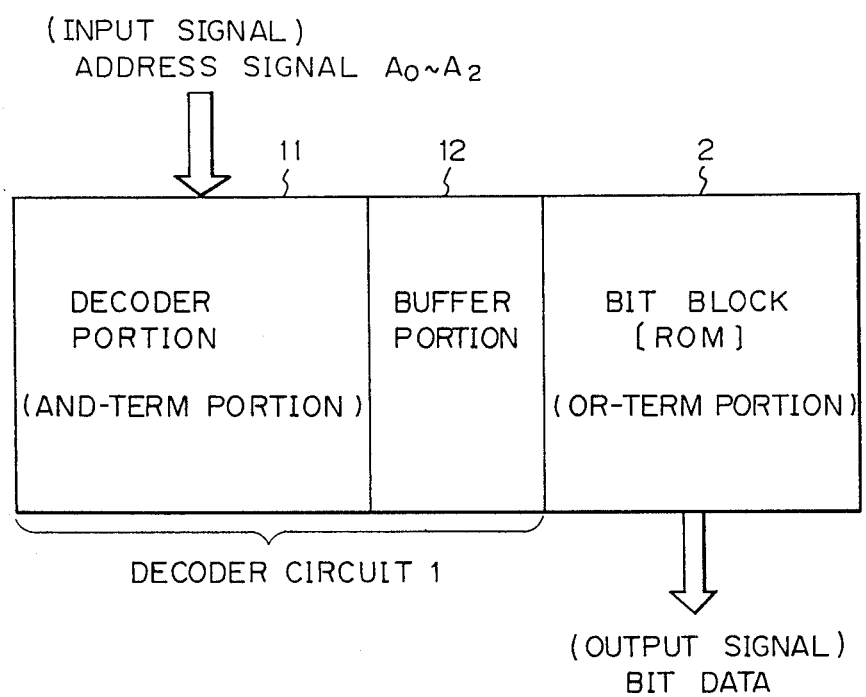
FIG. 4 is a block diagram showing an embodiment of a decoder circuit according to the present invention.

FIG. 4 is a block diagram showing one embodiment of a decoder circuit according to the present invention. As shown in FIG. 4, the decoder circuit 1 comprises a decoder portion 11, i.e., an AND-term portion, and a buffer portion 12. Namely, the control portion 113 of the conventional decoder circuit 101 of FIG. 1 is not needed for the present embodiment. The decoder circuit 1 is connected to a bit block 2, i.e., an OR-term portion, and selects one word line of the OR-term portion in accordance with an input signal comprising an address signal $A_0$-$A_2$, whereby an output signal comprising bit data is output from the bit block 2.

Figure 5:
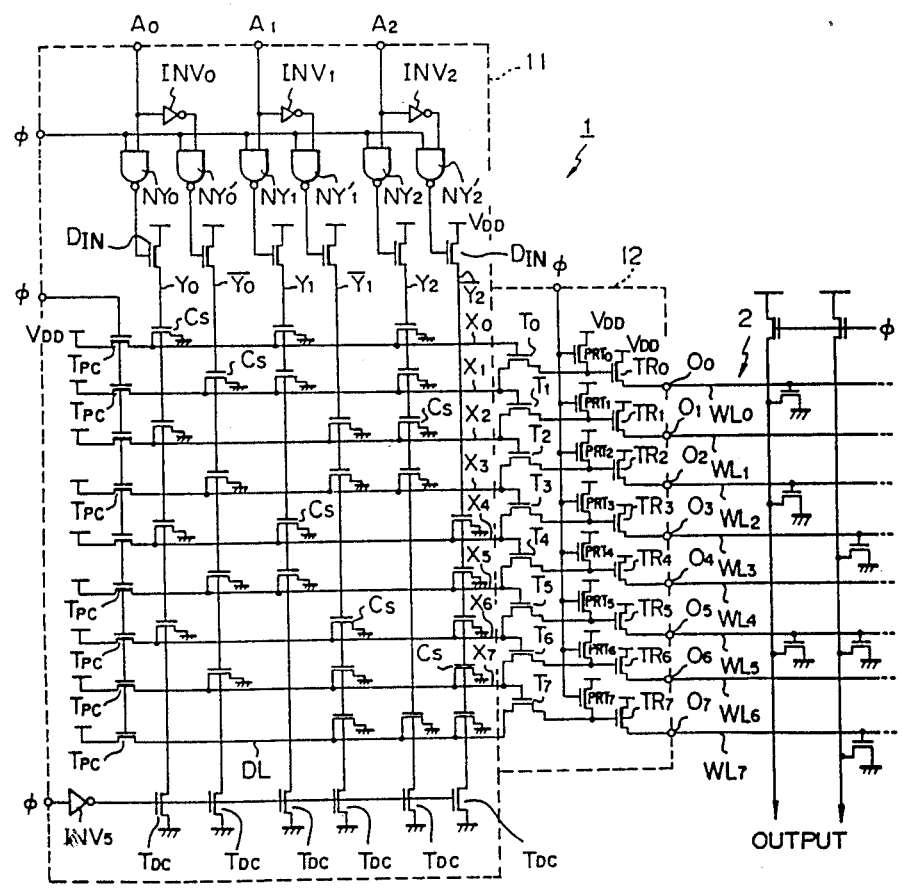
FIG. 5 is a circuit diagram showing one embodiment of the decoder circuit as shown in FIG. 4.

A circuit diagram of the embodiment according to the present invention is shown in FIG. 5. In this embodiment, the same portions as shown in the conventional decoder circuit of FIG. 2 are indicated by the same reference designations. In this decoder circuit 1, input signal conductors $Y_0$-$\overline{Y_2}$ are complemental signal conductors, such as the pair $Y_0$ and $\overline{Y_0}$, the pair $Y_1$ and $\overline{Y_1}$, and a pair of $Y_2$ and $\overline{Y_2}$. Output signal conductors $X_0$-$X_7$ are provided so as to cross the input signal conductors $Y_0$-$Y_2$ A cell transistor Cs is provided at each intersection of the input signal conductors $Y_0$-$Y_2$ and the output signal conductors $X_0$-$X_7$, and one of the output signal conductors is selected in accordance with decoding the input signals $A_0$-$A_2$. Note, each cell transistor Cs is formed by an N-channel MIS transistor.

In the decoder portion 11, input portions of the input signal conductors $Y_0$-$\overline{Y_2}$ are provided with NAND circuits $NY_0$-$NY_2'$ to which input signals $A_0$-$A_2$, inverted signals $\overline{A_0}$-$\overline{A_2}$ of the input signals $A_0$-$A_2$, and a clock signal $\phi$ are applied. Namely, at first input terminal of each of the NAND circuits $NY_0$, $NY_1$ and $NY_2$ is supplied with the input signals $A_0$, $A_1$, and $A_2$, respectively, first input terminal of each of the NAND circuits $NY_0'$, $NY_1'$ and $NY_2'$ is supplied with the inverted input signals $\overline{A_0}$, $\overline{A_1}$ and $\overline{A_2}$ from inverter circuits $INV_0$, $INV_1$ and $INV_2$, respectively, and the other, or second input terminals of all of the NAND circuits $NY_0$-$NY_2'$ are supplied with the clock signal $\phi$. The output terminals of the NAND circuits $NY_0$-$NY_2'$ are connected to the corresponding input signal conductors $Y_0$-$\overline{Y_2}$ through respective drive transistors $D_{IN}$, which are P-channel type MIS transistors.

In the above description, the decoder portion 11 of the decoder circuit 1 of the present embodiment has the same configuration as the conventional circuit, but in the present embodiment, the configuration of the buffer portion 12 is simpler than that of the conventional buffer portion, further, the present decoder circuit has high speed and stable operation, and the present embodiment does not need the control portion necessary in the conventional decoder circuit.

As shown in FIG. 5, in the buffer portion 12, the output end of each of the output signal conductors $X_0$-$X_7$ is connected to a gate electrode of the corresponding transistors transistor $T_0$-$T_7$ as are provided for the respective output signal conductors $X_0$-$X_7$, and the source electrode of each of the transfer transistors $T_0$-$T_7$ is connected to the respective, neighboring output signal conductor. For example, as to the transfer transistor $T_0$, the gate electrode of the transfer transistor $T_0$ is connected to the corresponding output signal conductor $X_0$, and the source electrode thereof is connected to the neighboring output signal conductor $X_1$. Similarly, as to the transfer transistor $T_1$, the gate electrode of the transfer transistor $T_1$ is connected to the corresponding output signal conductor $X_1$, and the source electrode thereof is connected to the neighboring output signal conductor $X_2$. Note, the dummy signal conductor DL is discharged to a low level regardless of the address signals $A_0$-$A_2$, during a decoder operation, and thus the dummy signal conductor DL is connected to the source electrode of the transfer transistor $T_7$.

The drain electrode of each of the transfer transistor $T_0$–$T_7$ is connected to the gate electrode of the respectively corresponding output transistor $TR_0$–$TR_7$ and the drain electrode of the respectively corresponding preset transistors $PRT_0$–$PRT_7$. Namely, the drain electrode of the transfer transistor $T_0$ is connected to the gate electrode of the output transistor $TR_0$ and the drain electrode of the preset transistor $PRT_0$, and the drain electrode of the transfer transistor $T_1$ is connected to the gate electrode of the output transistor $TR_1$ and the drain electrode of the preset transistor $PRT_1$. The source electrode of each preset transistor $PRT_0$–$PRT_7$ and of each output transistor $TR_0$–$TR_7$ is supplied with a power supply potential. The drain electrode of each output transistor $TR_0$–$TR_7$ is connected to the corresponding output terminals $O_0$–$O_7$. Note, in the buffer portion 12 of the decoder circuit 1, only three transistors are used for each word line one, i.e., of the transfer transistors $T_0$–$T_7$, the preset transistors $PRT_0$–$PRT_7$ and the output transistors $TR_0$–$TR_7$, and thus these three transistors can be provided in a small space between two adjacent signal conductors. Namely, the space between two adjacent signal conductors or the pitch of neighboring word lines may be made smaller. Note, the transfer transistors $T_0$–$T_7$ are N-channel type MIS transistors, and the preset transistors $PRT_0$–$PRT_7$ and the output transistors $TR_0$–$TR_7$ are P-channel type MIS transistors. Further, the output terminals $O_0$–$O_7$ are connected to word lines $WL_0$–$WL_7$ of the bit block 2. The bit block 2 is, for example, a read only memory having a plurality of word lines ($WL_1$–$WL_7$), a plurality of bit lines and a plurality of memory cells.

The other sides of the input signal conductors $Y_0$–$Y_2$ are provided with discharge transistors $T_{DC}$ which are switched ON while the clock signal $\phi$ is at a low level. These transistors are N-channel type MIS transistors, and the gate electrodes thereof are supplied with an inverted clock signal $\phi$ by an inverter $IV_5$.

The other sides of the output signal conductors $X_0$–$X_7$ are provided with precharge transistors Tpc driven by the clock signal $\phi$. The precharge transistors Tpc, which are P-channel type MIS transistors, are switched ON when the clock signal $\phi$ is at a low level, and the output signal conductors $X_0$–$X_7$ and the dummy signal conductor DL are precharged at a high level.

Figure 6:
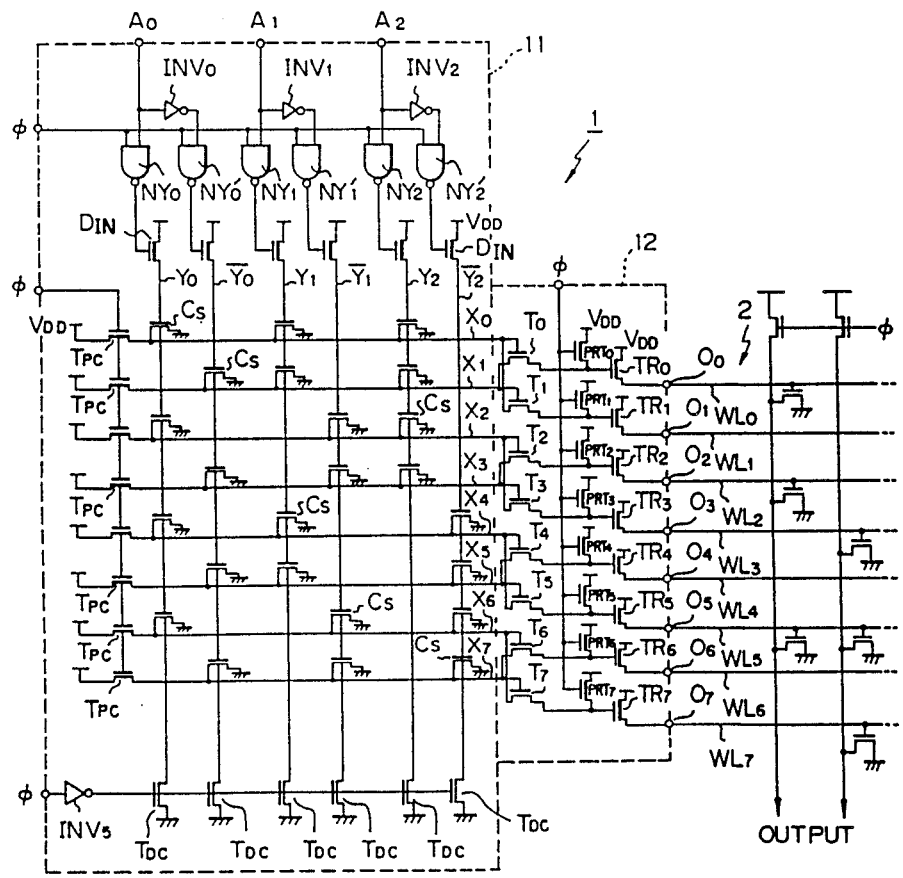
FIG. 6 is a circuit diagram showing a modification of the embodiment of the decoder circuit as shown in FIG. 5.
Figure 7:
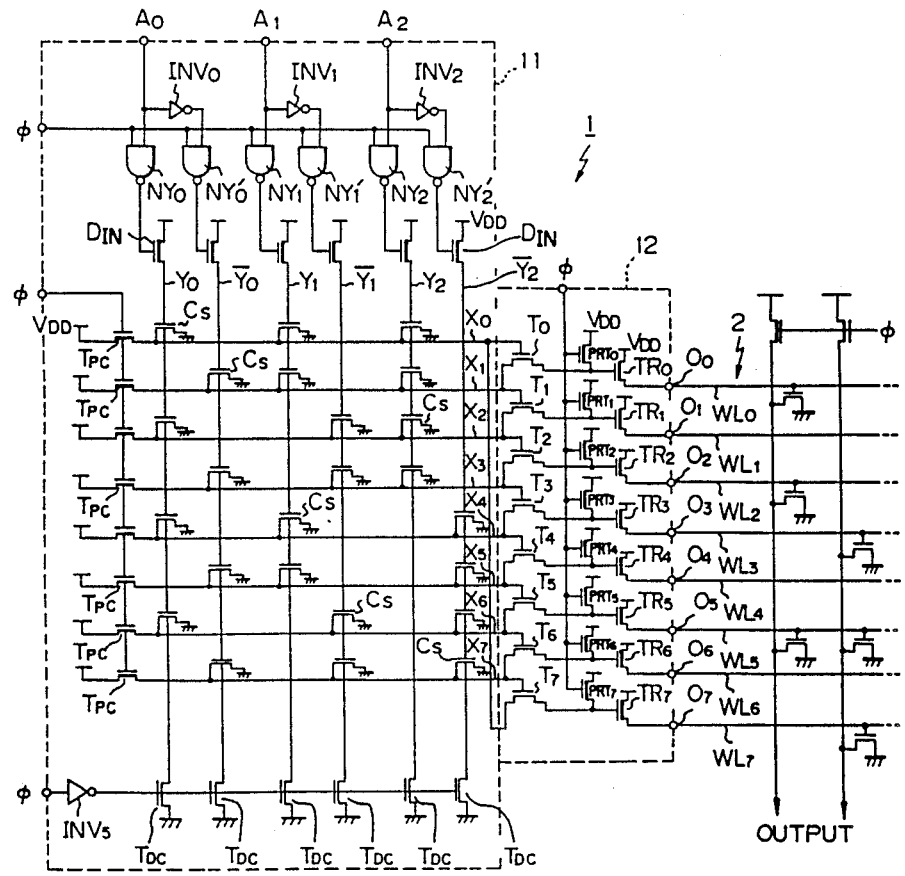
FIG. 7 is a circuit diagram showing another modification of the embodiment of the decoder circuit as shown in FIG. 5; and, FIG. 8 is a timing chart explaining an operation of the circuit shown in FIG. 5.

FIGS. 6 and 7 are circuit diagrams showing modifications of the embodiment of the decoder circuit shown in FIG. 5. In these decoder circuits, the dummy signal conductor DL is omitted.

As shown in FIG. 6, in one modification of the decoder circuit, output signal conductors $X_0$–$X_7$ are divided into pairs of two adjacent output signal conductors, a gate electrode of one transfer transistor of each pair is connected to one output signal conductor and a gate electrode of the other transfer transistor is connected to the other output signal conductor, and a source electrode of one transfer transistor is connected to the other output signal conductor and a source electrode of the other transfer transistor is connected to one output signal conductor, respectively. For example, in a pair of two adjacent output signal conductor $X_0$ and $X_1$, a gate electrode of a transfer transistor $T_0$ is connected to the output signal conductor $X_0$ and a source electrode of the transfer transistor $T_0$ is connected to the output signal conductor $X_1$, likewise the gate electrode of the transfer transistor $T_1$ is connected to the output signal conductor $X_1$ and a source electrode of the transfer transistor $T_1$ is connected to the output signal conductor $X_0$ Similarly, for example, as to pair of two adjacent output signal conductors $X_2$ and $X_3$, a gate electrode of the transfer transistor $T_2$ is connected to the output signal conductor $X_2$ and a source electrode of the transfer transistor $T_2$ is connected to the output signal conductor $X_3$, and a gate electrode of a transfer transistor $T_3$ is connected to the output signal conductor $X_3$ and a source electrode of the transfer transistor $T_3$ is connected to the output signal conductor $X_2$.

In another modification of the decoder circuit shown in FIG. 7, each of the output signal conductors $X_0$–$X_7$ is connected to the gate electrode of the respectively corresponding transfer transistor $T_0$–$T_7$, the source electrodes of the transfer transistors $T_0$–$T_6$, and thus excluding the last transfer transistor $T_7$, are connected to the respectively adjacent output signal conductors $X_1$–$X_7$, and the excluding the first signal conductor $X_0$. The source electrode of the last transfer transistor $T_7$ is connected to the first output signal conductor $X_0$ and thus in this context, the first output signal conductor $X_0$ is next adjacent to the last transfer transistor $T_7$.

As described above, in these modifications of the decoder circuit of FIGS. 6 and 7, the dummy signal conductor DL is omitted. Furthermore, as collectively demonstrated by FIGS. 5, 6 and 7, the respective source electrodes of the transfer transistors $T_0$–$T_7$ not only may be connected to the respective, next adjacent one of the output signal conductors $X_1$–$X_7$ and CL (i.e., the source electrode of any given on e of the transfer transistor $T_0$–$T_7$ may be connected to the output signal conductor, including dummy line DL, which is next adjacent to that output signal conductor which is connected to the gate electrode of the given one of the transfer transistors $T_0$–$T_7$), but also may be connected to any one of the other signal conductors $X_0$–$X_7$ and DL (i.e., as before, the "other" signal conductors being those which are not connected to the gate electrode of the given one of the transfer transistors $T_0$–$T_7$). Namely, for example, as to the transfer transistor $T_0$, the gate electrode of the transfer transistor $T_0$ is connected to the corresponding output signal conductor $X_0$, and the source electrode thereof can be connected to any other one of the signal conductors $X_1$, $X_2$, $X_3$, $X_4$, $X_5$, $X_6$, $X_7$ or DL. Similarly, in a transfer transistor $T_1$, a gate electrode of the transfer transistor $T_1$ is connected to the corresponding output signal conductor $X_1$, and the source electrode thereof can be connected to any other one of the signal conductors $X_0$, $X_2$, $X_3$, $X_4$, $X_5$, $X_6$, $X_7$ or DL.

The above described decoder circuits are formed by a C-MIS circuit, and as shown in FIGS. 5, 6, and 7, transistors drawn by a thick line are P-channel type MIS (P-MIS) transistors and transistors shown by a normal line are N-channel type MIS (N-MIS) transistors.

Figure 8:
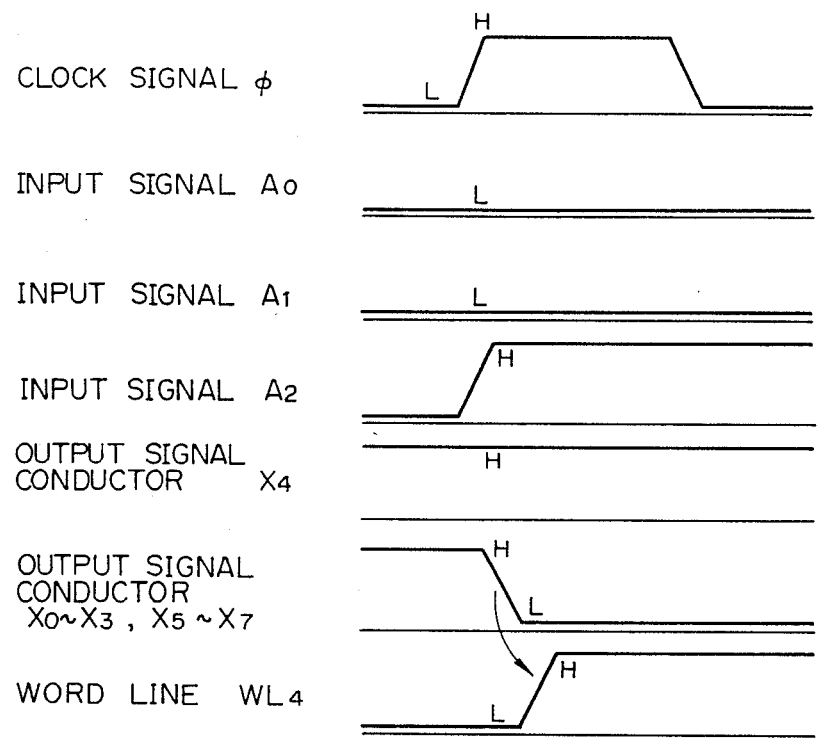

Next, an operation of the embodiment of the decoder circuit as shown in FIG. 5 is explained with reference to FIG. 8.

In this embodiment, only one transfer transistor (i.e., the selected one of the transistors $T_0$–$T_7$), having a gate electrode connected to the selected output signal conductor which is at a high level, is switched ON. The other transfer transistors, i.e., those having gate electrodes connected to the other non other, non-selected signal conductors, are not switched ON, since both the gate electrodes and source electrodes thereof are at a low level. The above operations are a principle of the present embodiment, and detailed explanation of these operations is given below.

First, in a decoder circuit, each node thereof is set to a specific potential in synchronization with a clock signal $\phi$, when the clock signal $\phi$ is at a low level. Namely, when the clock signal $\phi$ is at a low level, the gate electrode of each of the preset transistors $PRT_0$–$PRT_7$, which are P-channel type MIS transistors, is at a low level, and then all of the preset transistors $PRT_0$–$PRT_7$ are switched ON, whereby the gate potential of each of the output transistors $TR_0$–$TR_7$ is precharged to a high level state.

Further, at the same time, all of the precharge transistors $T_{PC}$ and the discharge transistors $T_{DC}$ are switched ON, each input signal conductor $Y_0$–$Y_2$ is discharged to a low level, and each output signal conductor $X_0$–$X_7$ is precharged to a high level.

The operation when the clock signal $\phi$ switches to a high level and address signals $A_0$–$A_2$ are supplied now will be explained. To simplify the explanation, the logical states of the address signals $A_0$, $A_1$ and $A_3$ are assumed to be the same as in FIG. 3, i.e., the address signal $A_0$ is at a low level, $A_1$ is at a low level, and $A_2$ is at a high level. In this state of the address signals $A_0$–$A_3$, similar to the example in FIG. 2, an output signal conductor $X_4$ is selected by NAND circuits $NY_0$–$NY_2$, inverter circuits $INV_0$–$INV_2$, drive transistors $D_{IN}$, and a cell transistor $C_S$. In this case, the potential of the output signal conductor $X_4$ is maintained at a high level, since all of the cell transistors $C_S$ connected to the output signal conductor $X_4$ are kept OFF. The potential levels of the other, non-selected output signal conductors $X_0$–$X_3$ and $X_5$–$X_7$ are thereby at a low level. Note, the potential level of the dummy signal conductor DL is also made low level.

As a result, the gate potential of the transfer transistor $T_4$ is kept at a high level, a source potential thereof is made low level, and only the single transfer transistor $T_4$ is switched ON, since the voltage between the gate electrode and the source electrode is higher than the threshold voltage thereof.

On the other hand, the transfer transistor $T_3$ is kept OFF, although the source potential thereof is at a high level since the source electrode of transfer transistor $T_3$ is connected to the selected conductor $X_4$, the gate potential thereof is at the low level since the gate electrode is connected to the non-selected conductor $X_3$, and as a result reverse bias is applied between the gate electrode and the source electrode thereof. The other transfer transistors $T_0$, $T_1$, $T_2$, $T_5$, $T_6$ and $T_7$ are kept OFF, since both the gate potential of each and the source potential thereof are made low level. Note, in each of these other transfer transistors $T_0$, $T_1$, $T_2$, $T_5$, $T_6$ and $T_7$, the gate potential thereof is made the same as the source potential thereof since both the gate and source electrodes are connected to respective ones of the other, non-selected conductors out of the total of the conductors $X_0$ to $X_7$ (and, in the case of FIG. 5, dummy line/conductor DL). Namely, when the transfer transistor $T_4$ is switched ON, the other transfer transistors $T_0$–$T_3$ and $T_5$–$T_7$ are switched OFF, because the relationship between the gate potential and the source potential of each of the transfer transistors $T_0$–$T_2$ and $T_5$–$T_7$ is such that the gate potential is gradually made low level and, at the same time, the source potential is made low level and because the gate potential of transfer transistor $T_3$ is at a low level (even though the source potential thereof is at a high level). Even if an environmental condition of the decoder circuit such as the ambient temperature is changed, the gate potential and the source potential of each transfer transistor $T_0$, $T_1$, $T_2$, $T_5$, $T_6$ and $T_7$ are made equivalent to each other and the gate potential of transfer transistor $T_3$ is less than the source potential thereof, and thus each of the transfer transistors $T_0$ to $T_7$ is kept OFF. Consequently, the gate potential is not higher than the source potential, and thus an OFF state is maintained and a selection error can not be made.

When the transfer transistor $T_4$ is switched ON, the gate electric charge of the output transistor $TR_4$ is discharged by the source electrode of the transfer transistor $T_4$ which is connected to an adjacent output signal conductor $X_5$, whereby the gate potential of the output transistor $TR_4$ is made low level. Therefore, the output transistor $TR_4$ is switched ON, and the word line $WL_4$ is made high level.

Note, in the present invention, the transistors of the decoder circuit can have a reverse polarity to those of the above embodiment. In this case, a P-channel MIS transistor is replaced by an N-channel MIS transistor, an N-channel MIS transistor is replaced by a P-channel MIS transistor, the logical value is reversed, the operation of each preset transistor $PRT_0$–$PRT$ being used for discharging, and the operation of each transfer transistor $T_0$–$T_7$ being used for charging.

As described above, in accordance with the present invention, only one output signal conductor is selected during a period of decode operation, but in which a timing signal is not used and a control circuit for outputting the timing signal is not required. Therefore, unnecessary delay is avoided and operation errors do not occur. Furthermore, since NAND circuits are not needed for the buffer portion of the present invention, the circuit is simpler and thus suitable for large scale integration.

Many widely different embodiments of the present invention may be constructed without departing from the spirit and scope of the present invention, and it should be understood that the present invention is not limited to the specific embodiments described in this specification, except as defined in the appended claims.

What is claimed is:

1. A decoder circuit responsive to a set of input signals for producing a decoded output signal during a related timing interval, comprising:
   a plurality of signal conductors;
   timing means producing a timing output defining a succession of alternate first and second timing intervals;
   a first potential setting means connected to said signal conductors and responsive to the timing output for setting the potential of each of said signal conductors to a first potential, in a first timing interval;
   a second potential setting means connected to said signal conductors and responsive to the timing output of said timing means and to a set of input signals for selecting one of said signal conductors, and for maintaining the potential of the selected signal conductor at said first potential and reducing the potential of the remaining said signal conductors to a second potential, in a second timing interval;
   a plurality of transfer transistors respectively associated with said plurality of signal conductors, each said transfer transistor having a gate electrode, a source electrode, and a drain electrode;

the gate electrode of each said transfer transistor being connected to the respectively associated signal conductor, and the source electrode of each said transfer transistor being connected to a related one of said plurality of signal conductors other than the respectively associated signal conductor connected to the gate electrode thereof, the potential levels of the gate and source electrodes of each said transfer transistor thereby being established by the potential levels of the corresponding, said respectively associated and related signal conductors; and the transfer transistor respectively associated with the selected signal conductor being switched ON by the first potential of the selected and respectively associated signal conductor as applied to the gate electrode thereof and the second potential of the related signal conductor as applied to the source electrode thereof and producing a decoded output signal, during the second timing interval.

2. A decoder circuit according to claim 1, wherein said plurality of signal conductors comprises a plurality of output signal conductors and a dummy signal conductor.

3. A decoder circuit according to claim 1, wherein said first potential setting means comprises a plurality of precharge transistors respectively corresponding to said plurality of signal conductors and each said precharge transistor being connected to the respectively corresponding said signal conductor.

4. A decoder circuit according to claim 3, further comprising:
power supply means for supplying at least a first power supply potential;
the source electrode of each of said precharge transistors being supplied with the first power supply potential, the gate electrode thereof being supplied with the timing output, and the drain electrode thereof being connected to said respectively corresponding signal conductor.

5. A decoder circuit according to claim 1, wherein said second potential setting means comprises:
a plurality of cell transistors respectively corresponding to said plurality of signal conductors, each said cell transistor being connected to the respectively corresponding signal conductor and said plurality of cell transistors being responsive to a set of the input signals during a related, second timing interval for selecting one of said signal conductors having a predetermined correspondence to the set of input signals and for maintaining the selected signal conductor at the first potential.

6. A decoder circuit according to claim 5, wherein said plurality of signal conductors comprises a plurality of input signal conductors and a plurality of output signal conductors, and further comprising:
means for applying the input signals of a set thereof to respectively corresponding ones of said plurality of input signal conductors;
each said cell transistor being respectively associated with one of said input signal conductors and one of said output signal conductors, and, as to each said cell transistor, the source electrode thereof being connected to said respectively associated output signal conductor, the gate electrode thereof being connected to said respectively associated input signal conductor, and the drain electrode thereof being supplied with the second potential; and said cell transistors being selectively rendered conductive and nonconductive, during the second timing interval and in accordance with the set of input signals applied to the gate electrodes thereof through the respectively corresponding input signal conductors, for selecting one of said output signal conductors and for maintaining the potential of the selected output signal conductor at the first potential and for reducing the potential of the remaining said output signal conductors to the second potential.

7. A decoder circuit according to claim 6, further comprising:
a plurality of drive transistors respectively associated with said plurality of input signal conductors at first ends thereof;
a plurality of NAND-gate respectively associated with said plurality of drive transistors, each NAND-gate having first and second inputs and an output and being connected at the output thereof to the respectively associated drive transistor, said plurality of NAND-gates being arranged in first and second sets;
means for applying the input signals of a set thereof directly to the first inputs of respective ones of the first set of plural NAND-gates and for inverting the input signals of the set and for applying the inverted said input signals of said set to the first inputs of respective ones of the second set of plural NAND-gates;
a plurality of discharge transistors respectively connected to said plurality of input signal conductors at second, opposite ends thereof; and
means for applying the timing output of said timing means to said second inputs of said NAND-gate circuits of each of said first and second sets thereof and for inverting the timing output for applying the inverted timing output to said plurality of discharge transistors.

8. A decoder circuit according to claim 1, wherein:
said plurality of signal conductors is arranged in an array of successive, adjacent signal conductors; and
as to each said transfer transistor, the course electrode thereof is connected to the signal conductor next adjacent to the signal conductor respectively corresponding thereof and connected to the gate electrode thereof.

9. A decoder circuit according to claim 1, wherein:
said plurality of signal conductors is arranged in an array of first to last, successive and parallel output signal conductors and a dummy signal conductor; and
the source electrode of the transfer transistor respectively corresponding to said last output signal conductor is connected to said dummy signal conductor.

10. A decoder circuit according to claim 1, wherein:
said plurality of signal conductors is arranged in an array of first to last, successive and parallel output signal conductors; and
the source electrode of the transistor, the gate electrode of which is connected to said last output signal conductor, is connected to the first output signal conductor.

11. A decoder circuit according to claim 8, wherein:

said plurality of signal conductors comprises a plurality of input signal conductors and a plurality of output signal conductors;

said plurality of output signal conductors being arranged in an array of successive pairs, each pair comprising first and second, adjacent output signal conductors;

said plurality of transfer transistors is arranged in a succession of pairs, each pair comprising first and second transfer transistors, respectively corresponding to said pairs of first and second output signal conductors, and as to each said respectively corresponding pair of transfer transistors and pair of output conductors, the source of the first transfer transistor is connected to the second output signal conductor and the source electrode of the second transfer transistor is connected to the first output signal conductor.

12. A decoder circuit according to claim 1, further comprising:

a plurality of preset transistors respectively associated with said plurality of transfer transistors;

a plurality of output transistors respectively associated with said plurality of transfer transistors, each said transfer transistor and respectively associated signal conductor further being respectively associated with a corresponding said output transistor and a corresponding said preset transistor, the drain electrode of each said transfer transistor being connected to the drain electrode of said associated preset transistor and to the gate electrode of said associated output transistor, the source electrode of each said preset transistor and of each said output transistor being maintained at the first potential and the timing output of said timing means being applied to the gate electrode of each said preset transistor; and a plurality of output terminals respectively corresponding to said plurality of output transistors, the drain of each said output transistor being connected to the respectively corresponding output terminal.

13. A decoder circuit according to claim 12, wherein:

said plurality of signal conductors comprises plural output signal conductors arranged in a parallel array with a predetermined space between adjacent said output signal conductors of the array; and for each given output signal conductor, the transfer, preset and output transistors respectively associated with that output signal conductor are disposed in the adjacent, predetermined space between the given output signal conductor and the next adjacent output signal conductor.

14. A decoder circuit according to claim 13, wherein all of said transistors are MIS type transistors.

15. A decoder circuit according to claim 14, wherein each of said precharge transistors is a P-channel type MIS transistor, each of said cell transistors is an N-channel type MIS transistor, and each of said transfer transistors is an N-channel type MIS transistor.

16. A read only memory system, comprising:

a read only memory having a plurality of input terminals; and a decoder circuit having a plurality of output terminals connected to respective input terminals of the read only memory and responsive to a set of input signals for producing a decoded output signal, during a related timing interval, at a corresponding output terminal thereof and accordingly for application to the respective input terminal of said read only memory, said decoder circuit comprising:

a plurality of signal conductors;

timing means producing a timing output defining a succession of alternate first and second timing intervals;

a first potential setting means connected to said signal conductors and respective to the timing output for setting the potential of each of said signal conductors to a first potential, in a first timing interval;

a second potential setting means connected to said signal conductors and responsive to the timing output of said timing means and to a set of input signals for selecting one of said signal conductors, and for maintaining the potential of the selected said signal conductor at said first potential and for reducing the potential of the remaining said signal conductors to a second potential, in a second timing interval;

a plurality of transfer transistors respectively associated with said plurality of signal conductors, each said transfer transistor having a gate electrode, a source electrode, and a drain electrode;

the gate electrode of each said transfer transistor being connected to the respectively associated signal conductor, and the source electrode of each said transfer transistor being connected to a related one of said plurality of signal conductors other than the respectively associated signal connected to the gate electrode thereof, the potential levels of the gate and source electrodes of each said transfer transistor thereby being established by the potential levels of the corresponding, said respectively associated and related signal conductors; and said transfer transistor respectively associated with the selected signal conductor being switched ON by the first potential of the selected and respectively associated signal conductor as applied to the gate electrode thereof and the second potential of the related signal conductor as applied to the source electrode thereof and producing the decoded output signal during the second timing interval.

* * * * *

UNITED STATES PATENT AND TRADEMARK OFFICE
CERTIFICATE OF CORRECTION

PATENT NO. : 4,962,327

DATED : Oct. 9, 1990

INVENTOR(S) : IWAZAKI

It is certified that error appears in the above-identified patent and that said Letters Patent is hereby corrected as shown below:

Title page, [57] ABSTRACT, line 8, delete "the";
          line 18, change "non selected" to --non-selected--.

Col. 1, line 16, before "one" insert --on--;
       line 32, delete "contents".

Col. 2, line 19, before "the" (first occurrence) insert --for--;
       line 20, delete "the";
       line 56, change "signal" to --signals--;
       line 57, after "selecting" insert --,--
       line 58, change "or" to --on--.

Col. 3, line 5, after "signal" insert --comprising--;
       line 6, delete "comprising of".

Col. 4, line 36, change "on" to --ON--;
       line 40, after "signals" insert --)--, and after "$A_2$" insert --.--.

Col. 5, line 25, delete "the" (second occurrence);
       line 47, change "transistor" to --transistors--.

Col. 6, line 18, after "$Y_0-Y_2$" insert --.--;
       line 28, change "at" to --a--;
       line 53, change "transistors transistor" to --transfer transistors--.

Col. 7, line 3, change "transistor" to --transistors--;
       line 5, change "transistor" to --transistors--;
       line 20, change "one, i.e.," to --i.e., one,--;
       line 63, change "conductor" to --conductors--.

UNITED STATES PATENT AND TRADEMARK OFFICE
CERTIFICATE OF CORRECTION

PATENT NO. : 4,962,327  
DATED : Oct. 9, 1990  
INVENTOR(S) : IWAZAKI

Page 2 of 2

It is certified that error appears in the above-identified patent and that said Letters Patent is hereby corrected as shown below:

Col. 8, line 3, after "$X_0$" insert --.--, and before "pair" insert --a--;  
line 19, change "the" (first occurrence) to --thus--;  
line 31, change "on e" to --one--;  
line 32, change "sistor" to --sistors--;  
line 46, change "in a" to --as to the--;  
line 66, delete "other non".

Col. 12, line 46, change "course" to --source--;  
line 49, change "thereof" to --thereto--;  
line 64, before "transistor" insert --transfer--.

Signed and Sealed this

Fourth Day of August, 1992

Attest:

DOUGLAS B. COMER

*Attesting Officer*   *Acting Commissioner of Patents and Trademarks*